(12) United States Patent
Tsao et al.

(10) Patent No.: US 11,155,915 B1
(45) Date of Patent: Oct. 26, 2021

(54) ARTIFICIAL DIAMOND PRODUCTION DEVICE AND MICROWAVE TRANSMITTING MODULE THEREOF

(71) Applicant: WAVE POWER TECHNOLOGY INC., Toufen (TW)

(72) Inventors: Ming-Hsiung Tsao, Zhubei (TW); Hsuan-Hao Teng, Taichung (TW); Han-Ying Chen, Chupei (TW)

(73) Assignee: WAVE POWER TECHNOLOGY INC., Toufen (TW)

(*) Notice: Subject to any disclaimer, the term of this patent is extended or adjusted under 35 U.S.C. 154(b) by 93 days.

(21) Appl. No.: 16/847,077

(22) Filed: Apr. 13, 2020

(51) Int. Cl.
    *C23C 16/27*     (2006.01)
    *C23C 16/511*     (2006.01)
    *C01B 32/26*     (2017.01)

(52) U.S. Cl.
    CPC ............ *C23C 16/274* (2013.01); *C01B 32/26* (2017.08); *C23C 16/511* (2013.01)

(58) Field of Classification Search
    USPC .............................. 118/723 MW; 156/345.41
    See application file for complete search history.

(56) References Cited

U.S. PATENT DOCUMENTS

| | | | |
|---|---|---|---|
| 4,913,928 A * | 4/1990 | Sugita | C23C 16/511 118/723 MA |
| 5,023,056 A * | 6/1991 | Aklufi | B01J 19/126 204/157.43 |
| 2006/0110546 A1 | 5/2006 | Vikharev et al. | |
| 2010/0218722 A1 | 9/2010 | Vikharev et al. | |

FOREIGN PATENT DOCUMENTS

| | | | |
|---|---|---|---|
| CN | 104726850 A | | 6/2015 |
| EP | 0520832 A1 | | 12/1992 |
| JP | H05239656 A | | 9/1993 |
| JP | 6-45098 | * | 2/1994 |
| JP | 2006140395 A | | 6/2006 |
| JP | 2009231662 A | | 10/2009 |

OTHER PUBLICATIONS

JPH0645098, Katayama (Year: 1994).*

* cited by examiner

*Primary Examiner* — Rakesh K Dhingra
(74) *Attorney, Agent, or Firm* — Rabin & Berdo, P.C.

(57) ABSTRACT

The present invention is an artificial diamond production device. A reaction chamber has a window. The diamond holder has a focus area facing toward the window. The microwave transmitting module is disposed outside the reaction chamber and has a microwave generator, a focusing-lens assembly, and a focusing mechanism. The microwave generator emits the microwave into the diamond holder via the window. The focusing-lens assembly is disposed between the diamond holder and the microwave generator. The focusing mechanism is connected to the focusing-lens assembly and a distance between the focusing-lens assembly and the microwave generator is changed by the focusing mechanism to focus the microwave on the focus area to improve the efficiency of producing artificial diamonds.

19 Claims, 4 Drawing Sheets

ARTIFICIAL DIAMOND PRODUCTION DEVICE AND MICROWAVE TRANSMITTING MODULE THEREOF

BACKGROUND OF THE INVENTION

1. Field of the Invention

The present invention relates to an artificial diamond production device and a microwave transmitting module thereof, and particularly to an artificial diamond production device and a microwave transmitting module thereof that uses a microwave plasma chemical vapor deposition method to form the microwave transmitting module of the artificial diamond production device.

2. Description of Related Art

In a conventional artificial diamond production device, a diamond seed crystal is placed into a reaction chamber having a high concentration of methane, and then a holder for the diamond seed crystal is placed at a regional standing wave strong electric field formed by a 2.45 GHz microwave in the reaction chamber. The energy of the standing wave of the microwave causes the hydrocarbon reaction gas such as methane around the diamond seed crystal to be heated to an extremely high temperature and forms a plasma ball, so that the carbon atoms of the hydrocarbon gas are attached onto the diamond seed crystal by the action of the plasma. Then the diamond seed crystal is gradually grown into an artificial diamond.

However, the location of the plasma ball which is ignited by the regional standing wave strong electric field of the microwave is easily affected by flow and distribution of the reaction gas, so it is difficult to focus stably on the holder of the diamond seed crystal, resulting in the inability to form a plasma ball around the diamond seed crystal, which results in that the production of an artificial diamond is highly time-consuming and energy-consuming.

To overcome the shortcomings of the conventional artificial diamond production devices, the present invention provides an artificial diamond production device and a microwave transmitting module thereof.

SUMMARY OF THE INVENTION

The main objective of the present invention is to provide an artificial diamond production device and a microwave transmitting module thereof, and particularly to an artificial diamond production device and a microwave transmitting module thereof that uses a microwave plasma chemical vapor deposition method to form the microwave transmitting module of the artificial diamond production device.

The microwave transmitting module of the artificial diamond production device in accordance with the present invention emits a microwave to a diamond holder in a reaction chamber, the reaction chamber has a window, the diamond holder has a focus area facing to the window, and the microwave transmitting module is disposed outside the reaction chamber and comprises:

a microwave generator having a transmitting port and emitting the microwave to the diamond holder via the transmitting port;

a focusing-lens assembly disposed between the diamond holder and the transmitting port to focus the microwave of the microwave generator; and a focusing mechanism connected to the focusing-lens assembly to change a distance between the focusing-lens assembly and the transmitting port to focus the microwave of the microwave generator on the focus area of the diamond holder.

The artificial diamond production device in accordance with the present invention has a reaction chamber having a window, and an external microwave emitted into the reaction chamber via the window;

a diamond holder disposed in the reaction chamber and having a focus area facing to the window;

a microwave transmitting module disposed outside the reaction chamber and having a microwave generator having a transmitting port and emitting the microwave to the diamond holder via the transmitting port;

a focusing-lens assembly disposed between the diamond holder and the transmitting port to focus the microwave of the microwave generator; and a focusing mechanism connected to the focusing-lens assembly to change a distance between the focusing-lens assembly and the transmitting port to focus the microwave of the microwave generator on the focus area of the diamond holder.

Other objects, advantages and novel features of the present invention will become more apparent from the following detailed description when taken in conjunction with the accompanying drawings.

DETAILED DESCRIPTION OF THE PREFERRED EMBODIMENT

Figure 1:
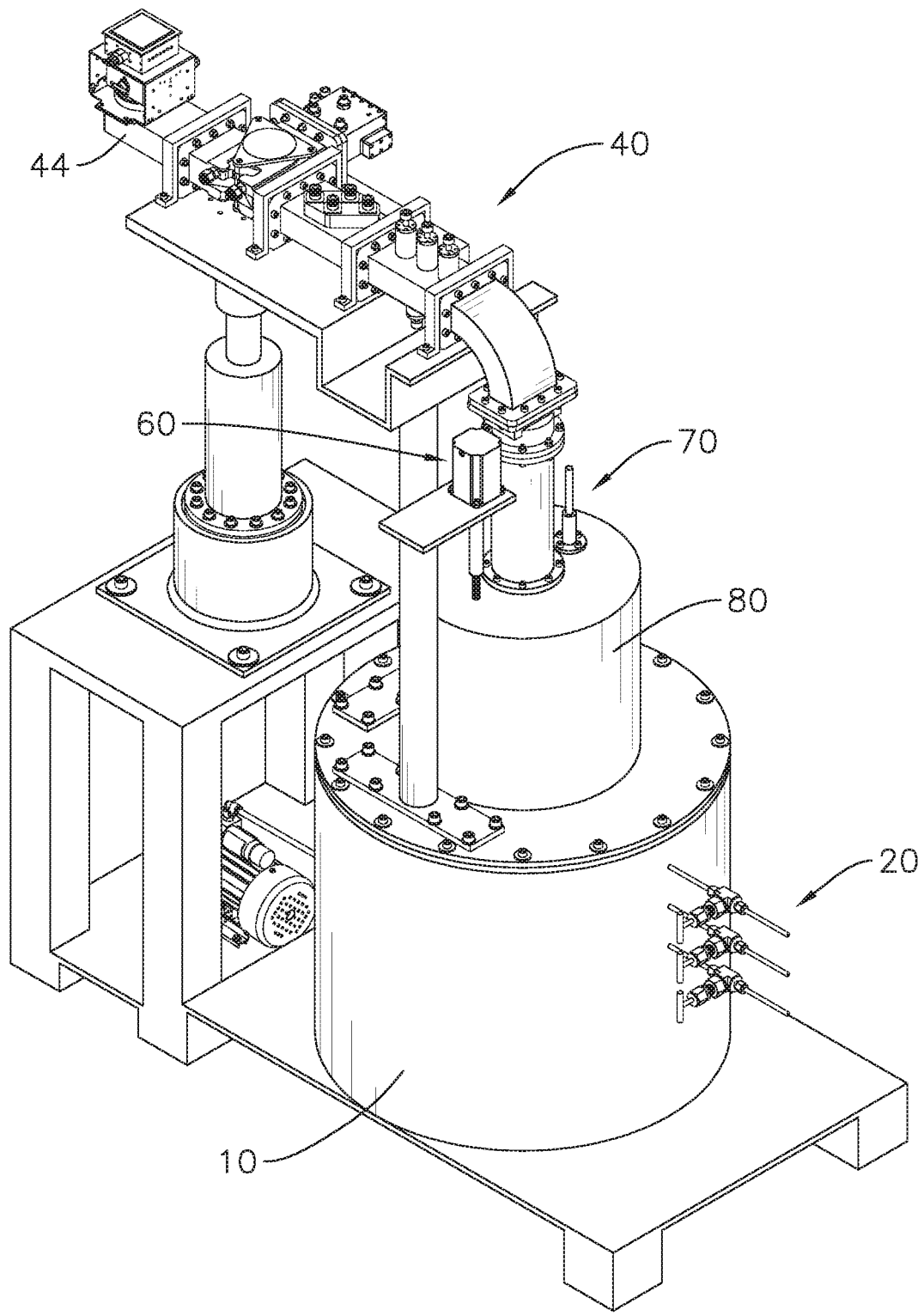
FIG. 1 is a perspective view of an artificial diamond production device in accordance with the present invention.
Figure 2:
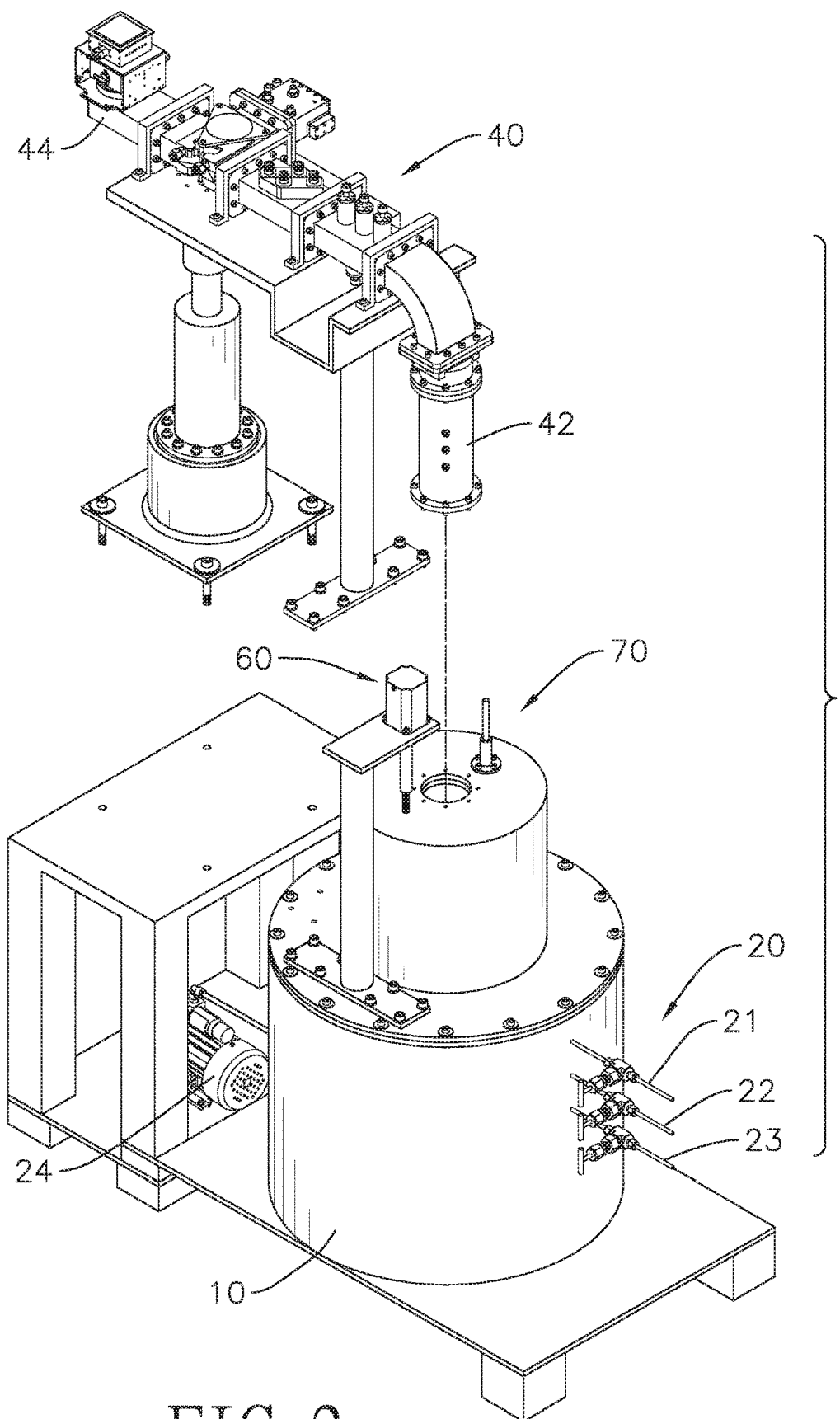
FIG. 2 is an exploded perspective view of the artificial diamond production device in FIG. 1.

With reference to FIGS. 1 to 4, an artificial diamond production device in accordance with the present invention includes a reaction chamber 10, a reaction gas control module 20, a diamond holder 30, and a microwave transmitting module. The microwave transmitting module is disposed outside the reaction chamber 10 and has a microwave generator 40, a focusing-lens assembly 50, and a focusing mechanism 60. Additionally, in the embodiment of the present invention, the microwave transmitting module further includes a linear motion assembly 70 and a microwave absorption casing 80.

Figure 4:
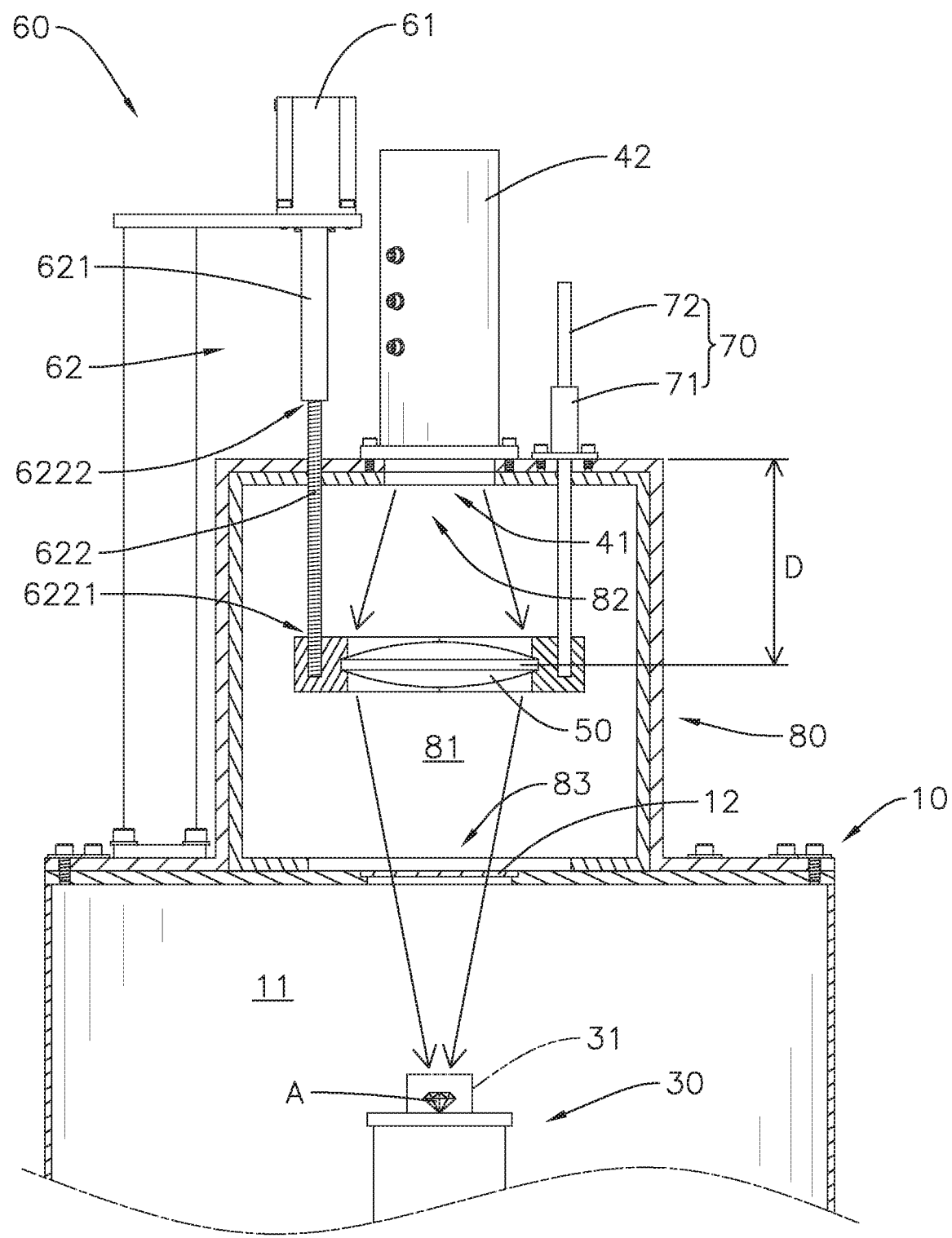
FIG. 4 is an enlarged side view in partial section of the artificial diamond production device shown in FIG. 1.

With further reference to FIG. 4, the reaction chamber 10 has a plasma reaction space 11 and a window 12. The plasma reaction space 11 is formed in the reaction chamber 10. The window 12 may be made of quartz, and is disposed on the reaction chamber 10 to allow an external microwave to emit into the plasma reaction space 11 via the window 12.

The reaction gas control module 20 is connected to the reaction chamber 10, communicates with the plasma reaction space 11 of the reaction chamber 10, and has a hydrocarbon gas source 21, a helium gas source 22, a hydrogen gas source 23, and a vacuum pump 24. The hydrocarbon gas source 21, the helium gas source 22, the hydrogen gas source 23, and the vacuum pump 24 all communicate with the plasma reaction space 11 to control a gas composition of the plasma reaction space 11 of the reaction chamber 10.

The diamond holder 30 is disposed in the plasma reaction space 11 of the reaction chamber 10 and has a side and a focus area 31. The side of the diamond holder 30 faces to the window 12 of the reaction chamber 10. The focus area 31 is disposed on the side of the diamond holder 30.

Figure 3:
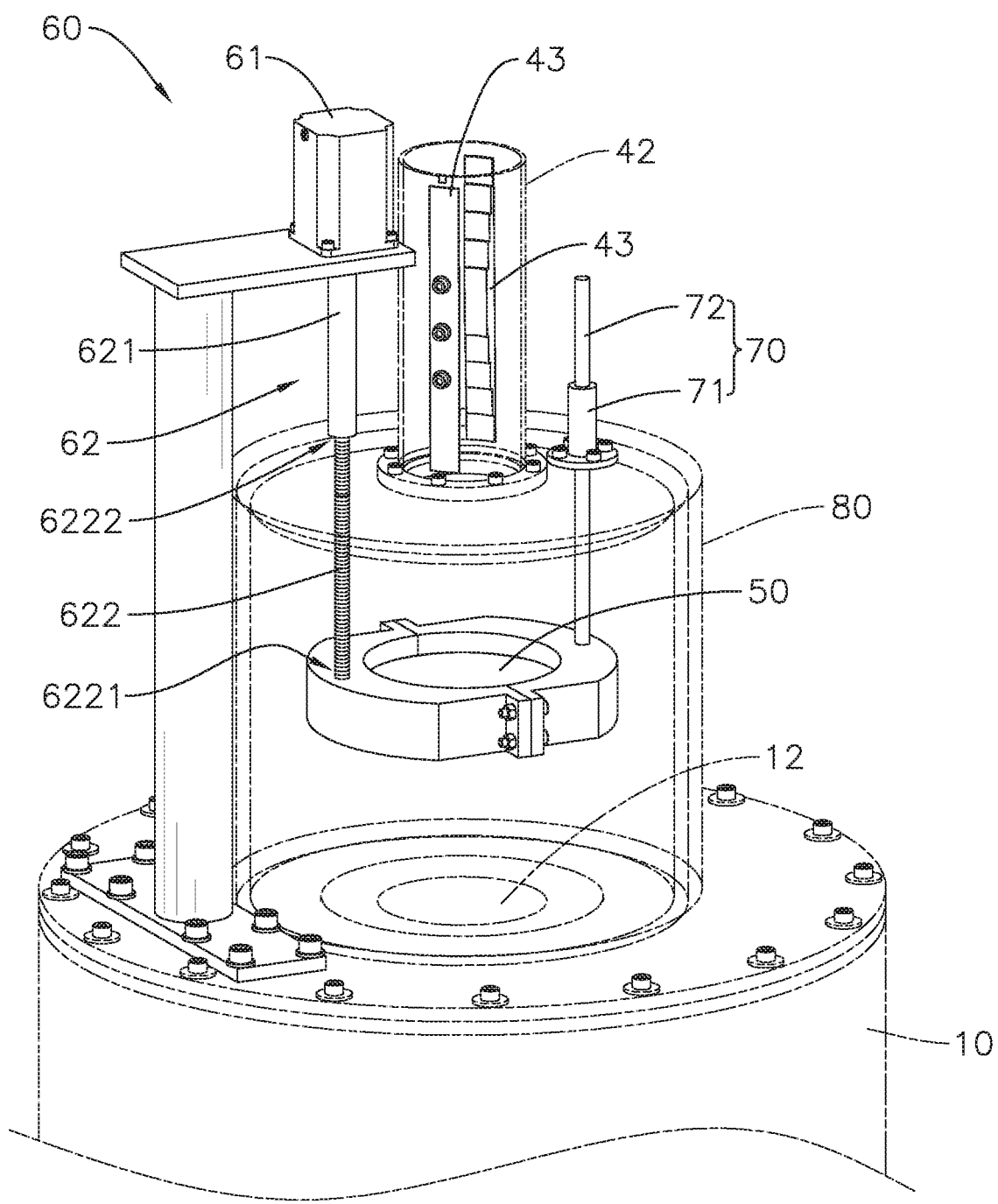
FIG. 3 is an enlarged perspective view of the artificial diamond production device in FIG. 1.

With reference to FIGS. 1, 3, and 4, the microwave generator 40 is disposed outside the reaction chamber 10 and has a transmitting port 41, a polarizing tube 42, and a linearly polarized electric field microwave source 44. The transmitting port 41 is disposed on the microwave generator 40, and the microwave generator 40 emits a microwave toward the diamond holder 30 via the transmitting port 41. Further, the transmitting port 41 is an opening formed on an end of the polarizing tube 42 toward the diamond holder 30. The linearly polarized electric field microwave source 44 is connected to the polarizing tube 42 opposite to the transmitting port 41, and emits a linearly polarized electric field microwave to the polarizing tube 42.

With reference to FIG. 3, the polarizing tube 42 has two polarizing plates 43 being elongated and disposed opposite to each other at a spaced interval. Each polarizing plate 43 extends along a direction of a traveling path of the microwave. The two polarizing plates 43 convert the microwave in the polarizing tube 42 from the linearly polarized electric field microwave entering an upper end of the polarizing tube 42 to a circularly polarized electric field microwave leaving a lower end of the polarizing tube 42, and further causes the transmitting generator to emit the circularly polarized electric field microwave toward the diamond holder 30 via the transmitting port 41. In order to improve the manufacturing quality of artificial diamonds, the microwave generator 40 is not limited to emit the circularly polarized electric field microwave.

A thickness of each polarizing plate 43 is tapered from a middle of the polarizing plate 43 to two opposite ends of the polarizing plate 43, in order to match the microwave impedance entering the upper end of the polarizing tube 42 and leaving the lower end of the polarizing tube 42 to reduce the amount of microwave reflection. Preferably, the thickness of each polarizing plate 43 may be linearly tapered from the middle to the two opposite ends of the polarizing plate 43 (that is, a stepped surface is replaced with an inclined surface), may be arc-tapered (that is, the stepped surface is replaced with an arc surface), or may be multi-fold point tapered (that is, the stepped surface is replaced by a plurality of connected inclined surfaces). In addition, the microwave generator 40 may have only one polarizing plate 43.

The focusing-lens assembly 50 is disposed between the diamond holder 30 and the transmitting port 41 of the microwave generator 40 to focus the circularly polarized electric field microwave of the microwave generator 40. In the present invention, the transmitting port 41, the window 12, the focusing-lens assembly 50, and the focus area 31 of the diamond holder 30 are sequentially arranged along a line. In the present invention, the focusing-lens assembly 50 is either a dielectric convex lens or a combination of concave and convex lens, and the material of the focusing-lens assembly 50 is preferably ceramic or high-density polyethylene (HDPE).

With reference to FIG. 4, the microwave absorption casing 80 is connected to the microwave generator 40 and the reaction chamber 10 and has a receiving room 81, an inlet 82, and an outlet 83. The receiving room 81 is formed in the microwave absorption casing 80. The inlet 82 is disposed on the microwave absorption casing 80, and communicates with the transmitting port 41 of the microwave generator 40 and the receiving room 81. The outlet 83 is disposed on the microwave absorption casing 80, abuts an external surface of the reaction chamber 10 around the window 12, and communicates with the receiving room 81. The focusing-lens assembly 50 is disposed in the receiving room 81 of the microwave absorption casing 80. The microwave absorption casing 80 may be made of a high dielectric loss (or hysteresis loss) material, which can absorb an electric field component (or magnetic field component) of the microwave, so as to prevent the microwave from causing multiple reflections inside the microwave absorption casing 80, and even leaking outside the microwave absorption casing 80 from seams between the microwave absorption casing 80 and other components of the artificial diamond production device, so the microwave absorption casing 80 has an effect of reducing the amount of microwave leakage from the microwave transmitting module.

With reference to FIG. 4, the focusing mechanism 60 is connected to the focusing-lens assembly 50 to adjust a distance D between the focusing-lens assembly 50 and the transmitting port 41 of the microwave generator 40 to focus the circularly polarized electric field microwave of the microwave generator 40 on the focus area 31 of the diamond holder 30. In the present invention, the focusing mechanism 60 has a motor 61 and a screw assembly 62. The motor 61 is disposed on the reaction chamber 10 above the microwave absorption casing 80. The screw assembly 62 is connected to the motor 61, is securely connected to the focusing-lens assembly 50, and has a rotating element 621 and a moving element 622. The rotating element 621 is connected to the motor 61 and is driven to rotate by the motor 61. The moving element 622 is connected to the rotating element 621 and is securely connected to the focusing-lens assembly 50. The rotating element 621 is driven to rotate by the motor 61 and the moving element 622 is driven by the rotating element 621 to move linearly relative to the rotating element 621.

In detail, the focusing mechanism 60 is disposed outside the microwave absorption casing 80, the rotating element 621 is a sleeve and has an inner thread formed on an inner surface of the sleeve and an end mounted to a rotating shaft of the motor 61, and the moving element 622 is an externally threaded rod that slidably passes through the microwave absorption casing 80. The moving element 622 has a lens end 6221 and a sleeve end 6222 opposite to each other, the lens end 6221 is securely connected to the focusing-lens assembly 50 and the sleeve end 6222 extends into and is screwed with the rotating element 621. When the motor drives the rotating element 621 to rotate, the rotation of the rotating element 621 drives the moving element 622 to move linearly relative to the rotating element 621 by the engagement between the inner thread of the rotating element 621 and the externally threaded rod of the moving element 622. Then the distance D between the focusing-lens assembly 50 and the transmitting port 41 of the microwave generator 40 can be changed or adjusted.

Furthermore, the focusing mechanism 60 is disposed outside the microwave absorption casing 80, and only the rod-shaped moving element 622 extends into the microwave absorption casing 80, and a gap between the moving element 622 and the microwave absorption casing 80 can be designed smaller, thereby reducing leakage of microwave of the microwave generator 40. In addition, the focusing mechanism 60 can be easy adjusted and maintained since the focusing mechanism 60 is disposed outside the microwave absorption casing 80, but the specific structure of the focusing mechanism 60 is not limited in the present invention. For example, the rotating element 621 and the moving element 622 may be respectively an externally threaded rod and a sleeve, and even the focusing mechanism 60 may be other forms of actuators or manual adjustment mechanisms.

The linear motion assembly 70 is connected to the focusing-lens assembly 50 and the microwave absorption casing 80, and has a fixing element 71 and a sliding element 72. The fixing element 71 is securely mounted on the microwave absorption casing 80. The sliding element 72 is slidably mounted in the fixing element 71, extends into the microwave absorption casing 80, and is securely connected to the focusing-lens assembly 50. The linear motion assembly 70 and the focusing mechanism 60 are respectively connected to two opposite ends of the focusing-lens assembly 50 to enhance the stability of the focusing-lens assembly 50. The fixing element 71 is not limited to fix on the microwave absorption casing 80, and the position of the fixing member 71 is fixed with respect to the transmitting port 41. For example, the fixing element 71 may also be securely connected to the microwave generator 40. In the present invention, the linear motion assembly 70 is a ball guide assembly, that is, the fixing element 71 is a linear bearing, the sliding element 72 is a straight rod body, the straight rod body slidably extends through the fixing element 71, and the sliding element 72 is parallel with the moving element 622.

When the present invention is in use, a diamond seed crystal A is placed on the focus area 31 of the diamond holder 30, and the circularly polarized electric field microwave of the microwave generator 40 is focused on the focus area 31 of the diamond holder 30 by the focusing-lens assembly 50 to produce an artificial diamond. When a focusing location of the circularly polarized electric field microwave deviates from the focus area 31, the distance D between the focusing-lens assembly 50 and the transmitting port 41 can be adjusted by the focusing mechanism 60. Then the circularly polarized electric field microwave can be focused on the focus area 31 of the diamond holder 30.

According to the above-mentioned features and structural relationships of the present invention, the distance D between the focusing-lens assembly 50 and the transmitting port 41 of the microwave generator 40 can be changed and adjusted by the focusing mechanism 60 to correct the focusing location of the microwave so that a plasma ball can be formed stably around the diamond seed crystal A to improve the efficiency of producing an artificial diamond.

Even though numerous characteristics and advantages of the present invention have been set forth in the foregoing descriptions, together with details of the structure and function of the present invention, the disclosure is illustrative only, and changes may be made in detail, especially in matters of shape, size, and arrangement of parts within the principles of the present invention to the full extent indicated by the broad general meaning of the terms in which the appended claims are expressed.

What is claimed is:

1. A microwave transmitting module of an artificial diamond plasma production device including a microwave transmitting module that emitting a microwave, to a diamond holder in a reaction chamber, the reaction chamber having a window, the diamond holder having a focus area facing to the window, and the microwave transmitting module disposed outside the reaction chamber and comprising:
   a microwave generator having a transmitting port and emitting the microwave to the diamond holder via the transmitting port;
   a focusing-lens assembly and disposed between the diamond holder and the transmitting port to focus the microwave of the microwave generator; and
   a focusing mechanism connected to the focusing-lens assembly to change a distance between the focusing-lens assembly and the transmitting port to focus the microwave of the microwave generator on the focus area of the diamond holder, wherein the focusing mechanism includes a motor and a screw assembly connected to the motor.

2. The microwave transmitting module as claimed in claim 1, wherein
   the screw assembly has
      a rotating element connected to the motor; and
      a moving element connected to the rotating element and securely connected to the focusing-lens assembly, and a rotation of the rotating element driving the moving element to move linearly relative to the rotating element.

3. The microwave transmitting module as claimed in claim 2, wherein
   the rotating element is a sleeve, and has an inner thread formed on an inner surface of the sleeve and an end connected to the motor; and
   the moving element is an externally threaded rod and has
      a lens end securely connected to the focusing-lens assembly; and
      a sleeve end extending into and screwed with the rotating element.

4. The microwave transmitting module as claimed in claim 3, wherein a microwave absorption casing is connected to the microwave generator and the reaction chamber and has
   a receiving room formed in the microwave absorption casing;
   an inlet disposed on the microwave absorption casing, and communicating with the receiving room and the transmitting port of the microwave generator; and
   an outlet disposed on the microwave absorption casing, abutting an external surface of the reaction chamber around the window, and communicating with the receiving room;
   wherein the focusing-lens assembly is disposed in the receiving room, the focusing mechanism is disposed outside the microwave absorption casing, and the moving element of the screw assembly of the focusing mechanism slidably extends into the microwave absorption casing.

5. The microwave transmitting module as claimed in claim 4, wherein a linear motion assembly is connected to the focusing-lens assembly and has
   a fixing element in a position fixed relative to the transmitting port; and
   a sliding element slidably connected to the fixing element and securely connected to the focusing-lens assembly;
   wherein the linear motion assembly and the focusing mechanism are respectively connected to two opposite ends of the focusing-lens assembly.

6. The microwave transmitting module as claimed in claim 5, wherein
   the fixing element is a linear bearing and is securely connected to the microwave absorption casing; and
   the sliding element is a straight rod body, slidably extends through the fixing element and slidably extends into the microwave absorption casing, and the sliding element has two ends, one of the two ends is disposed in the receiving room and is securely connected to the focusing-lens assembly, and the other one of the two ends is disposed outside the microwave absorption casing.

7. The microwave transmitting module as claimed in claim 4, wherein
the microwave generator has a polarizing tube;
the transmitting port is an opening formed on an end of the polarizing tube toward the diamond holder; and
the polarizing tube has at least one polarizing plate being elongated, extending along a direction of a traveling path of the microwave of the microwave generator, and having a thickness being tapered from a middle of the at least one polarizing plate to two opposite ends of the at least one polarizing plate.

8. The microwave transmitting module as claimed in claim 7, wherein
the polarizing tube has two polarizing plates disposed opposite to each other at a spaced interval; and
the microwave generator has a linearly polarized electric field microwave source connected to the polarizing tube opposite to the transmitting port, and emitting a linearly polarized electric field microwave to the polarizing tube;
wherein the polarizing tube converts the linearly polarized electric field microwave to a circularly polarized electric field microwave emitted toward the diamond holder via the transmitting port.

9. The microwave transmitting module as claimed in claim 4, wherein the focusing-lens assembly is selected from a dielectric convex lens and a combination of concave and convex lens.

10. The microwave transmitting module as claimed in claim 3, wherein
the microwave generator has a polarizing tube;
the transmitting port is an opening formed on an end of the polarizing tube toward the diamond holder; and
the polarizing tube has at least one polarizing plate being elongated, extending along a direction of a traveling path of the microwave of the microwave generator, and having a thickness being tapered from a middle of the at least one polarizing plate to two opposite ends of the at least one polarizing plate.

11. The microwave transmitting module as claimed in claim 10, wherein
the polarizing tube has two polarizing plates disposed opposite to each other at a spaced interval; and
the microwave generator has a linearly polarized electric field microwave source connected to the polarizing tube opposite to the transmitting port, and emitting a linearly polarized electric field microwave to the polarizing tube;
wherein the polarizing tube converts the linearly polarized electric field microwave to a circularly polarized electric field microwave emitted toward the diamond holder via the transmitting port.

12. The microwave transmitting module as claimed in claim 3, wherein the focusing-lens assembly is selected from a dielectric convex lens and a combination of concave and convex lens.

13. The microwave transmitting module as claimed in claim 2, wherein
the microwave generator has a polarizing tube;
the transmitting port is an opening formed on an end of the polarizing tube toward the diamond holder; and
the polarizing tube has at least one polarizing plate being elongated, extending along a direction of a traveling path of the microwave of the microwave generator, and having a thickness being tapered from a middle of the at least one polarizing plate to two opposite ends of the at least one polarizing plate.

14. The microwave transmitting module as claimed in claim 13, wherein
the polarizing tube has two polarizing plates disposed opposite to each other at a spaced interval; and
the microwave generator has a linearly polarized electric field microwave source connected to the polarizing tube opposite to the transmitting port, and emitting a linearly polarized electric field microwave to the polarizing tube;
wherein the polarizing tube converts the linearly polarized electric field microwave to a circularly polarized electric field microwave emitted toward the diamond holder via the transmitting port.

15. The microwave transmitting module as claimed in claim 2, wherein the focusing-lens assembly is selected from a dielectric convex lens and a combination of concave and convex lens.

16. The microwave transmitting module as claimed in claim 1, wherein
the microwave generator has a polarizing tube;
the transmitting port is an opening formed on an end of the polarizing tube toward the diamond holder; and
the polarizing tube has at least one polarizing plate being elongated, extending along a direction of a traveling path of the microwave of the microwave generator, and having a thickness being tapered from a middle of the at least one polarizing plate to two opposite ends of the at least one polarizing plate.

17. The microwave transmitting module as claimed in claim 16, wherein
the polarizing tube has two polarizing plates disposed opposite to each other at a spaced interval; and
the microwave generator has a linearly polarized electric field microwave source connected to the polarizing tube opposite to the transmitting port, and emitting a linearly polarized electric field microwave to the polarizing tube;
wherein the polarizing tube converts the linearly polarized electric field microwave to a circularly polarized electric field microwave emitted toward the diamond holder via the transmitting port.

18. The microwave transmitting module as claimed in claim 1, wherein the focusing-lens assembly is selected from a dielectric convex lens and a combination of concave and convex lens.

19. An artificial diamond plasma production device comprising:
a reaction chamber having a window, and an external microwave emitted into the reaction chamber via the window;
a diamond holder disposed in the reaction chamber and having a focus area facing to the window;
a microwave transmitting module disposed outside the reaction chamber and having
a microwave generator having a transmitting port and emitting the microwave to the diamond holder via the transmitting port;
a focusing-lens assembly facing the window and disposed between the diamond holder and the transmitting port to focus the microwave of the microwave generator; and
a focusing mechanism connected to the focusing-lens assembly to change a distance between the focusing-lens assembly and the transmitting port to focus the microwave of the microwave generator on the focus area of the diamond holder, wherein the focusing mechanism includes a motor and a screw assembly connected to the motor.

\* \* \* \* \*